Figure 1:
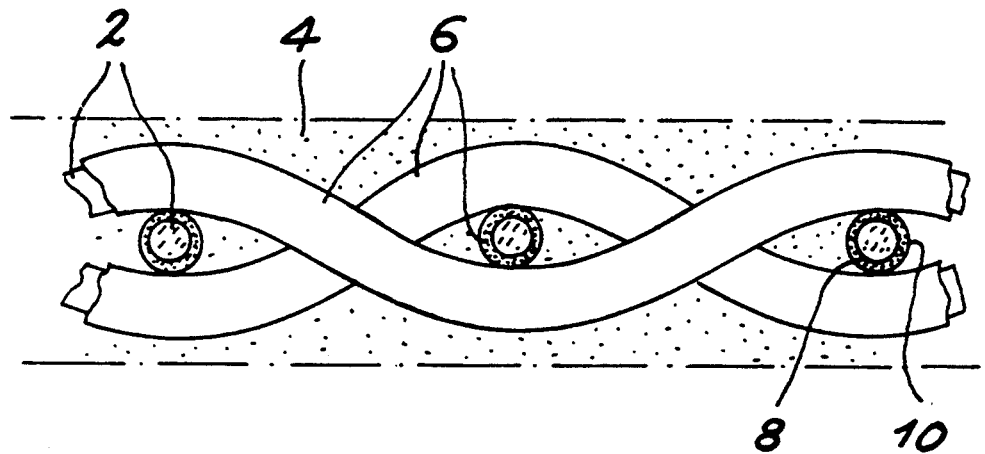

United States Patent [19]

Saugnac

[11] Patent Number: 5,334,438
[45] Date of Patent: Aug. 2, 1994

[54] COMPOSITE MATERIAL WITH A REFRACTORY FIBROUS REINFORCEMENT AND ITS PRODUCTION PROCESS

[75] Inventor: Frédéric Saugnac, Pessac, France

[73] Assignee: Societe Nationale Industrielle et Aerospatiale, Paris, France

[21] Appl. No.: 797,720

[22] Filed: Nov. 25, 1991

[30] Foreign Application Priority Data

Nov. 28, 1990 [FR] France ................... 90 14874

[51] Int. Cl.$^5$ .................... B32B 9/00; C23C 16/02
[52] U.S. Cl. ................... 428/212; 428/213; 428/245; 428/336; 428/366; 428/367; 428/378; 428/380; 428/384; 428/408; 428/426; 428/432; 264/29.5; 264/29.6; 252/502; 252/504; 252/506
[58] Field of Search ............... 428/336, 378, 380, 384, 428/403, 404, 408, 213, 212, 446, 245, 698, 689, 366, 367, 378, 380, 384, 408, 426, 432; 252/502, 678, 708; 264/29.4, 29.5, 29.6, 252, 502, 504, 506

[56] References Cited

U.S. PATENT DOCUMENTS 5,094,901  3/1992  Gray .................... 428/141

Primary Examiner—Patrick J. Ryan
Assistant Examiner—Richard C. Weisberger
Attorney, Agent, or Firm—Hayes, Soloway, Hennessey, Grossman & Hage

[57] ABSTRACT

This composite material with a fibrous reinforcement has refractory fibres (2) embedded in a nonmetallic matrix (4) and an interphase material (6) interposed between the fibres and the matrix, the interphase material being boron carbonitride with a lamellar or amorphous structure containing in atomic %, 0 to 98% nitrogen, 1 to 99% carbon and 1 to 99% boron. The composition of the interphase material can be homogeneous or vary gradually from the fibre-material interface (8) to the material-matrix interface (10).

39 Claims, 1 Drawing Sheet

COMPOSITE MATERIAL WITH A REFRACTORY FIBROUS REINFORCEMENT AND ITS PRODUCTION PROCESS

DESCRIPTION

The present invention relates to composite materials incorporating reinforcing refractory fibres embedded in a matrix and to their production process.

The term refractory fibre is understood to mean any fibre able to withstand, without any fundamental deterioration or modification, a temperature of at least 700° C. under a non-reactive atmosphere with the fibre. These fibres are e.g. of carbon, silicon nitride or carbide, silicon carbonitride (SiCN), alumina, silica, zirconia, aluminosilicates such as boron aluminosilicate (BAS), mullite ($2SiO_2$-$2Al_2O_3$), etc.

The fibrous reinforcement ensures the strength and rigidity of the composite material parts and the matrix ensures the connection between the reinforcing fibres and the transfer of forces.

The matrix can be an organic or an inorganic matrix. As inorganic matrixes reference is made to ceramic, vitroceramic and glass (borosilicate) matrixes. An organic matrix can be used for increasing the neutron capture cross-section of a composite material.

The term ceramic matrix is understood to mean any refractory compositions of the oxide, carbide, boride and nitride type, as well as carbon matrixes. Reference is made as ceramic matrixes to those of aluminium nitride, silicon carbide or nitride, silicon or boron carbonitride, oxide matrixes such as $ZrO_2$-$TiO_2$, $ZrO_2$-$SiO_2$, $Al_2O_3$ and mullite.

The term vitroceramic is used to define refractory compositions of the metallic silicate type such as e.g. lithium aluminosilicates (LAS), lithium and magnesium aluminosolicates (MLAS).

These composite materials can be used in numerous industrial fields and in particular in the space, aeronautical, car and nautical fields, as well as in connection with competitive sports and in general for producing lightweight mechanical parts having a high mechanical strength.

When the composite materials are of the ceramic-ceramic type, they are more particularly usable in applications requiring high thermomechanical properties.

The association of fibres and matrixes of different physicochemical natures leads to interface problems between the fibres and the matrix such as wetability, adhesion and oxidation.

For example, a ceramic matrix has a limited elongation at break, a poor tensile strength and a considerable notching sensitivity. In this case, a weak fibre-matrix bond is required for obtaining a material which is relatively insensitive to shocks and the propagation of cracks initiated by any defect in the matrix. Thus, the cracking coming from the matrix is then stopped and/or deflected to the fibre-matrix interface, which gives the material a non-fragile break.

However, the material is not then resistant by constitution, because it is known that the obtaining of composite materials with high mechanical properties requires a strong bond between the fibrous structure and the matrix.

To solve the different interface problems, use is generally made of an organic or inorganic interphase material deposited on fibres and/or in the matrix. This interphase material has an elongation at break greater than that of the matrix, so as to improve the mechanical properties of the composite materials. In addition, said interphase layer can provide chemical protection against oxidation or corrosiveness/aggressiveness of certain matrixes with respect to fibres.

The interphase materials of the ceramic-ceramic composites presently used are laminar pyrocarbon or boron nitride (BN), which are both anisotropic materials having a lamellar crystallographic structure or in the form of leaves which are weakly bonded together, cf. FR-A-2 567 874.

The use of carbon as the interphase material considerably limits the field of application of composite materials due to the low temperature oxidation (405° C.) of the carbon and the transformation of the latter into gas, which tends to escape from the composite material. The composite materials with a carbon interphase material can consequently not be used for high temperature, long-term applications.

Boron nitride in leaf form has a better resistance to oxidation than carbon. It only starts to oxidize at 800° C. in order to give rise to a solid condensed phase ($B_2O_3$), which remains in the composite material and reduces the oxidation rate of the underlying boron nitride.

It is also known to use multilayer interphase materials, as described in FR-A-2 641 776. These multiple interphase materials have a crystalline boron nitride or pyrocarbon layer associated with an amorphous material control interphase defining a preferred direction zone for the cracks propagated in the matrix.

These multilayer interphase materials somewhat complicate the production process for the composite materials (change of reagents and deposition conditions), the duration of the production of these materials and therefore the cost of producing them.

In a composite material having a metallic matrix, it is known e.g. from FR-A-2 273 080 to use a compound containing carbon, nitrogen and boron for enveloping tungsten fibres with a view to improving the wetability of these fibres by the metallic binder, the latter tending to form droplets and prevent the correct densification of the fibrous preform.

The invention aims at improving the mechanical properties of composite materials having refractory fibres for producing a weak matrix-fibre bond. These composite materials are in particular those having a nonmetallic matrix (ceramic, vitroceramic or glass).

The invention relates to a composite material having a refractory fibrous reinforcement incorporating a novel interphase material for producing a weak fibre-matrix bond, particularly with a view to obviating the aforementioned disadvantages. In particular, said novel interphase material has an oxidation resistance greater than that of carbon and even greater than that of boron nitride. In addition, the production of the composite material according to the invention is much simpler than that of composite materials having a multiple interphase material.

The invention is based on a novel refractory material based on boron, nitrogen and carbon, which can be deposited in thin film form on composite material fibres. This refractory material constitutes a true carbon-boron-nitrogen solid solution, called boron carbonitride. This solid solution can have variable compositions, ranging from almost pure carbon to almost pure boron nitride. The composition is chosen as a function of the nature of the fibres and the matrix used and according to the envisaged application.

In particular, the composition of the boron carbonitride can be adapted in such a way that its expansion coefficient is as close as possible to that of the matrix, thus limiting cracking risks in the latter. As a function of its structure and its composition, the expansion coefficient of boron carbonitride varies from $1.10^{-6}/K$ to $36.10^{-6}/K$.

More specifically, the invention relates to a composite material having a fibrous reinforcement, incorporating refractory fibres embedded in a nonmetallic matrix, and an interphase material interposed between the fibres and the matrix, characterized in that the interphase material is boron carbonitride having a lamellar and/or amorphous structure containing in atomic % 0 to 98% nitrogen, 1 to 99% carbon and 1 to 99% boron.

According to the invention, the interphase boron carbonitride has a homogeneous composition over its entire thickness or a non-homogeneous composition. The boron carbonitride will be designated CBN hereinafter. The structure of the CBN is a function of its composition. It is therefore possible to adapt the structure of the interphase material as a function of the nature of the fibres and the matrix, as well as the envisaged application. In particular, the BN-rich CBN has an amorphous structure, whereas the CBN which is rich in C and B and containing little or no N has a crystalline structure in leaf or lamellar form such as pyrocarbon and boron nitride. Between the amorphous state and the crystalline state, the CBN has an intermediate structure, which is increasingly organized as the C quantity increases.

The crystalline structure appears for a carbon concentration exceeding 60 atomic % and a B/N ratio exceeding 1.87 and the amorphous structure appears for a carbon concentration below 42 atomic % and a B/N ratio below 1.45.

Apart from the advantages referred to hereinbefore, the CBN has an expansion coefficient below that of BN, so that the CBN has a reduced delamination tendency compared with BN, thus leading to a better cohesion of the composite material.

Moreover, the crystalline CBN oxidizes at 820° C. forming $B_2O_3$ and therefor an autoprotection layer. The crystalline BN oxidizes at 800° C. in order to also form a $B_2O_3$ layer, but with an oxidation rate higher than that of CBN. Moreover, the crystalline CBN has a thermal stability up to 2000° C. under a non-reactive atmosphere.

In atomic %, the boron carbonitride contains 5 to 85% nitrogen, 5 to 85% carbon and 10 to 90% boron. Preferably, the CBN contains, in atomic %, 5 to 50% nitrogen, 5 to 85% carbon and 10 to 50% boron.

For certain compositions, the CBN has semiconducting properties.

When the interphase material is homogeneous, the latter can have a crystalline, amorphous or intermediate structure. For example, the interphase material can have the following compositions $C_5B_2N$ or $C_6B_2N$ (approximately corresponding to the formula $C_{0.64}B_{0.24}N_{0.18}$) or the composition $C_{0.40}B_{0.33}N_{0.27}$; $C_{35.7}B_{37}N_{27.3}$; $C_{24}B_{39.4}N_{36.8}$; $C_{66.7}B_{23.2}N_{12.4}$; $C_{78.6}B_{15.06}N_{6.33}$; $C_{41}B_{34.7}N_{24.4}$; $C_{58}B_{29}N_{13.7}$. It can also have the compositions $BC_x$ with $0 \leq x \leq 10$ and e.g. the composition $BC_3$.

When the interphase material is inhomogeneous, i.e. it has a composition and a structure varying from the fibre-material interface to the material-matrix interface, it is particularly interesting that the composition varies in such a way that the structure evolves gradually from the amorphous state to the crystalline state from the fibre-material interface to the material-matrix interface.

This gradual adaptation of the structure of the interphase material gives the composite materials excellent mechanical properties and which are in particular improved compared with those of the prior art composite materials. This evolutive structure can be very easily obtained in the same deposition enclosure and with the same conditions and reagents, which is not possible with the known interphase materials.

Obviously the invention is applicable to all the matrix types referred to hereinbefore, the invention being particularly well adapted to ceramic and vitroceramic matrixes.

In particular, the invention is of great interest when the matrix is of silicon nitride, silicon carbide, LAS, MLAS, CBN or AlN. When the matrix is of CBN, the solid solution used has a crystalline structure and in particular the matrix is $C_5B_2N$.

Moreover, although the invention is applicable to all the fibre types referred to hereinbefore, it is particularly suitable for fibres of SiC, $Si_3N_4$, $Al_2O_3$, $SiO_2$, BAS and SiCN.

In order to obtain good results, the thickness of the interphase material must exceed a certain minimum. Beyond a certain thickness, an interphase material is no longer obtained and instead a composite material with a mixed matrix is obtained. Generally the thickness of the CBN interphase is chosen between 0.05 and 3 micrometers.

In addition, the thickness of the interphase layer is dependent on the nature of the matrix. The thickness of the interphase layer decreases when the elongation at break of the matrix increases.

In particular, for ceramic matrixes, the thickness of the interphase material is 1 to 1.5 micrometer, whereas for glass or vitroceramic matrixes the thickness of the interphase material is between 0.1 and 0.6 micrometer.

The invention also relates to a process for producing a composite material with a fibrous reinforcement, as described hereinbefore.

According to a first embodiment, said process incorporates the following stages:

a) the deposition of an interphase material in the form of boron carbonitride on the refractory fibres, the boron carbonitride having an atomic % composition of 0 to 98% nitrogen, 1 to 99% carbon and 1 to 99% bron and a lamellar and/or amorphous structure, b) the formation of a porous fibrous reinforcement from fibres coated with the interphase material and c) the densification of the porous reinforcement obtained in b) in order to form a nonmetallic matrix.

The fibrous reinforcement can in particular be produced by the well known filamentary winding method. This stage leads directly to the shaping of a mechanical part.

According to a second embodiment, the inventive process involves the following stages:

a') formation of the porous fibrous reinforcement from refractory fibres, b') infiltration of boron carbonitride into the porous reinforcement obtained in a') to form an interphase material on the fibres, the boron carbonitride having an atomic % composition of 0 to 98% nitrogen, 1 to 99% carbon and 1 to 99% boron and a lamellar and/or amorphous structure and c') the densification of the porous reinforcement obtained in b') to form a nonmetallic matrix.

In this case, the fibrous reinforcement consists of a stack or weave of fibres and then the shaping of the reinforcement as a function of the mechanical part to be produced.

Densification can be carried out according to any known densification procedure and in particular by the gaseous or liquid route, by the infiltration of powders or by the sol-gel method.

The boron carbonitride can be produced as from 700° C. by chemical vapour deposition (CVD) using a reactive gaseous source mixture of boron, ammonia and hydrocarbon diluted in a carrier gas such as nitrogen or preferably hydrogen, under a pressure of a few hundred thousand Pascals. The gaseous boron sources are in particular $B_2H_6$ or boron halides such as $BCl_3$ or $BF_3$.

The hydrocarbon can be one or more hydrocarbons substituted to a greater or lesser extent and having 1 to 5 carbon atoms. It is possible to use chlorinated hydrocarbons such as $CHCl_3$ or $CCl_4$ or preferably acetylene.

The CBN CVD deposition pressure and temperature can be adapted as a function of the hydrocarbon used.

The dilution of the reactive mixture by hydrogen, although unnecessary, improves the efficiency of the operation. Moreover, compared with nitrogen, hydrogen changes the reaction mechanism used in the gaseous phase leading to more structured products of the same composition.

As stated hereinbefore, the composition of the CBN can be modified as a function of the sought properties and in particular the compatibility properties with materials to be contacted with it. As a function of this composition, the structure or arrangement of the different atoms of the CBN varies.

The products obtained usually obtain a boron excess compared with nitrogen. It is also advantageous to use a boron trichloride/ammonia ratio exceeding 1.

Moreover, the obtaining of a CBN monophase necessitates the use of a partial ammonia pressure at the most equal to the partial hydrocarbon pressure. When the partial ammonia pressure exceeds that of the hydrocarbon, a two-phase BN and CBN structure is obtained.

In order to obtain a CBN composition varying gradually from the fibre-material interface to the material-matrix interface, everything else being equal, it is sufficient to modify the ammonia quantity introduced into the reactive mixture.

In particular, it is possible within the same deposition reactor and retaining the same deposition conditions, with the exception of the ammonia quantity, to form a CBN layer passing progressively from the amorphous state to the crystalline state. The crystalline organization of the CBN increases when the ammonia quantity in the reactor decreases.

It is also possible to use as the reactive mixture, a gaseous boron source (particularly boron trichloride) and nitrogenous hydrocarbons for supplying both the nitrogen and the carbon. The nitrogenous hydrocarbon can be such that the nitrogen quantity in the CBN is below that of the boron. Reference is made to acetonitrile as a nitrogenous hydrocarbon.

The use of a reactive mixture of boron trichloride and nitrogenous hydrocarbon is particularly interesting for the deposition of a CBN layer at atmospheric pressure on a fibre moving continuously in the deposition reactor. This procedure permits a homogeneous CBN deposit over the entire fibre length. The use of a nitrogenous hydrocarbon makes it possible to avoid, in this particular case, the use of $NH_3$ and therefore the nucleation of CBN in the gaseous phase. The nitrogenous hydrocarbon used must have a high thermal stability, the working temperatures being between 750° and 1000° C. (approximately).

Other features and advantages of the invention can be gathered from the following illustrative, non-limitative description with reference to the attached drawing, wherein show:

FIG. 1 diagrammatically a composite material according to the invention.

Figure 2:
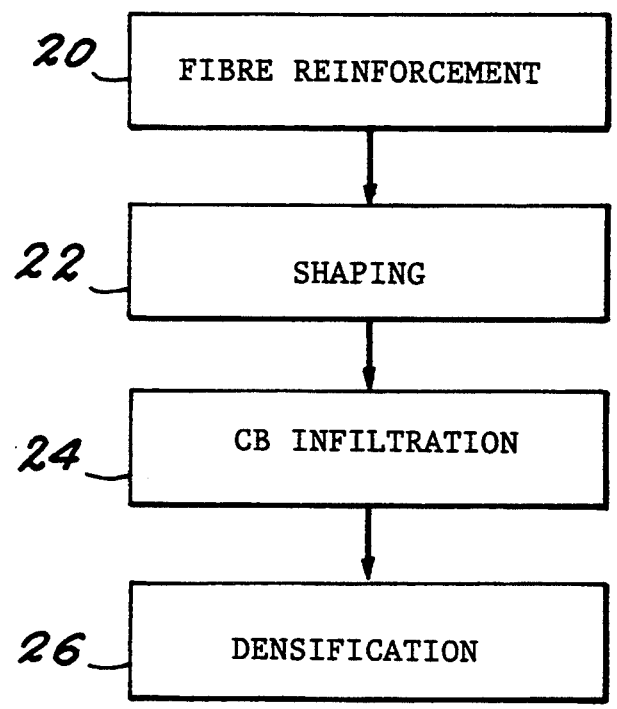

FIG. 2 a diagram illustrating the different stages of the production process for a composite material part according to the invention.

FIG. 1 diagrammatically shows a ceramic-ceramic composite material having SiC reinforcing fibres 2 embedded in a silicon nitride, silicon carbonitride or LAS matrix 4. The diameter of the fibres is approximately 10 micrometers and they are woven.

According to the invention, each fibre 2 is coated with a CBN coating 6 having a thickness of 1 to 1.5 micrometer ensuring a weak bond between the matrix and the fibres and thus leading to the obtaining of a composite material with a non-fragile structure. The CBN has an elongation at break exceeding that of the silicon nitride or LAS matrix.

According to the invention, the layer 6 has a composition varying gradually from the fibre-CBN interface 8 to the CBN-matrix interface 10. The BN quantity decreases gradually from the interface 8 to the interface 10, whilst the carbon quantity increases gradually from the interface 8 to the interface 10.

According to the invention, the composition is such that the structure evolves from the amorphous to the crystalline state from interface 8 to interface 10. In particular, the CBN at the interface 8 has the composition $C_{0.40}B_{0.33}B_{0.27}$ and the CBN at the interface 10 has the composition $C_5B_2N$.

A description will be given hereinafter, with reference to FIG. 2, of a production example for a composite material part according to the invention.

As symbolized by block 20 in FIG. 2, the first stage of the process consists of forming a deformable, porous SiC structure by weaving the SiC fibres 2 in three orthogonal directions and in known manner. The fibres are SiC Nicalon fibres sold by Nippon Carbon.

The second stage of the process, illustrated by block 22, consists of shaping the fibrous reinforcement in such a way that it forms the preform of the composite material part to be produced.

This is followed by a CB infiltration, symbolized by block 24, into the preform, so as to form the CBN interface layer 6 on the fibres. The CBN is deposited by CVD using a reactive mixture of $BCl_3$, $C_2H_2$, $NH_3$ diluted in hydrogen.

The operating conditions are as follows:
deposition temperature at least 1000° C. and typically between 1000° and 1100° C.,
total pressure 15 hPa,
$C_2H_2$ flow rate 0.6 l/h,
$BCl_3$ flow rate 1 l/h,
$NH_3$ flow rate below 0.6 l/h,
dilution rate of the reactive gases in hydrogen exceeding 10, speed of the gases 1 m/sec.

The growth kinetics is a function proportional to the $NH_3$ flow rate and proportional to the temperature and is inversely proportional to the pressure. The growth kinetics r satisfies the equation $0.5 \leq r \leq 5$ micrometer/hour. Moreover, the carbon quantity in the CBN increases with the deposition temperature. The $NH_3$ flow rate controls the composition of the product.

When the partial $NH_3$ pressure is close to the partial $C_2H_2$ pressure, the CBN is amorphous, whereas when the partial $NH_3$ pressure is five times lower than the partial $C_2H_2$ pressure, the CBN is crystalline.

By progressively increasing the $NH_3$ flow rate in the deposition reactor, a CBN layer 6 is obtained, whose carbon composition increases from the interface 8 to the interface 10 and whose structure evolves gradually from the amorphous state to the crystalline state.

The following stage of the process, represented by block 26, relates to the densification of the CBN-infiltrated fibrous structure with a view to forming the ceramic matrix.

According to a first example, the matrix is of $Si_3N_4$. It is produced by chemical vapour deposition of a gaseous mixture containing ammonia and a chlorinated silane such as $SiCl_4$ or $SiHCl_3$ in a $(NH_3)/(SiCl_4$ or $SiHCl_3)$ ratio of 4:3. This deposition takes place at about 1050° C. under 6 hPa.

According to a second example, the matrix is of LAS. It is formed by the sol-gel method. To this end, a sol containing 90.13 g of aqueous silica suspension (LUDOX AS 40 of Du Pont de Nemours), 20.68 g of lithium nitrate, 112.54 g of aluminium nitrate and 13.17 g of ammonium tetraborate was prepared in 240 cm$^3$ of water. The pH of the sol was adjusted to 1.

The CBN-infiltrated fibrous structure is then impregnated by the sol and dried at ambient temperature. This impregnation-drying cycle is repeated seven times. The preimpregnate is then dehydrated at 100° C. for 1 hour. This is followed by a hot compression stage at 900° C. for 30 minutes. A uniaxial pressure of 12.5 Mpa is progressively applied from 500° C. to the end of hot compression. The pressure is relieved during cooling.

The maximum use temperature of said composite material is 830° C. If the material is treated under an ammonia atmosphere for 2 hours at 800° C., it can be seen that the maximum use temperature is raised to 950° C.

Under the same conditions as those described hereinbefore relative to FIG. 2, it is possible to directly deposit the CBN on the fibres before assembling them for forming the porous reinforcement structure. After the shaping of the porous structure, it is densified.

I claim:

1. Composite material having a fibrous reinforcement, incorporating refractory fibres (2) embedded in a nonmetallic matrix (4) and an interphase material (6) interposed between the fibres and the matrix, characterized in that the interphase material has a thickness between 0.05 and 3 micrometers, and comprises a solid solution having a structure selected from the group consisting of a lamellar structure, an amorphous structure, and an intermediate structure between the amorphous and the lamellar structure, said solid solution containing in atomic %, 1 to 99% carbon, 1 to 99% boron, and up to 98% nitrogen.

2. Composite material according to claim 1, characterized in that the solid solution comprises a boron carbonitride of the formula $BC_x$ with $3 \leq x \leq 10$.

3. Composite material according to claim 1, characterized in that the BN (boron and nitrogen) quantity of the composition of the interphase material decreases gradually from the fibre material interface (8) to the material-matrix interface (10).

4. Composite material according to claim 1, characterized in that the interphase material has an evolutive structure passing gradually from the amorphous state to the lamellar state from the fibre-material interface (8) to the material-matrix interface (10).

5. Composite material with a fibrous reinforcement incorporating refractory fibres (2) embedded in a matrix (4) and an interphase material (6) interposed between the fibers and the matrix, characterized in that the interphase material is boron carbonitride, the BN (boron and nitrogen) quantity of which decreases gradually from the fibre-material interface (8) to the material matrix interface (10).

6. Composite material according to claim 4, characterized in that the interphase material (6) has an evolutive structure passing gradually from the amorphous state to the lamellar crystalline state from the fibre-material interface (8) to the material-matrix interface (10).

7. Composite material according to claim 1, characterized in that the matrix (4) is a ceramic, vitroceramic or glass matrix.

8. Composite material according to claim 1, characterized in that the matrix (4) is of $Si_3N_4$, SiC, LAS, MLAS or AlN.

9. Composite material according to claim 1, characterized in that the fibres (2) are nonmetallic fibres.

10. Composite material according to claim 1, characterized in that the fibres (2) are of SiC, $Si_3N_4$, $Al_2O_3$, $SiO_2$, BAS or SiCN.

11. Composite material according to claim 1, characterized in that the solid solution is formed by chemical vapor deposition using a reactive gaseous source mixture of boron and nitrogenous hydrocarbon diluted in a carrier gas.

12. Composite material according to claim 1, characterized in that the solid solution is formed by chemical vapor deposition using a reactive gaseous source mixture of boron, ammonia and hydrocarbon diluted in a carrier gas.

13. Composite material according to claim 1, characterized in that the solid solution is formed by chemical vapor deposition using a reactive mixture of boron trichloride, ammonia and hydrocarbon diluted in a carrier gas.

14. Composite material according to claim 1, characterized in that the solid solution is formed by chemical vapor deposition using a reactive gaseous source mixture of boron and nitrogenous hydrocarbon diluted in a carrier gas.

15. Composite material according to claim 13, characterized in that the boron trichloride/ammonia ratio is $>1$.

16. Composite material according to claim 13, characterized in that the partial ammonia pressure is at the most equal to the partial hydrocarbon pressure.

17. composite material according to claim 13, characterized in that the hydrocarbon is acetylene.

18. Composite material according to claim 13, characterized in that the dilution rate of the reactive mixture in the carrier gas exceeds 10.

19. Composite material according to claim 13, characterized in that there is a gradual variation of the ammonia quantity in the reactive mixture.

20. Composite material according to claim 13, characterized in that there is a gradual decrease of the ammonia quantity in the reactive mixture.

21. Composite material according to claim 5, characterized in that the interphase material (6) has a thickness between 0.05 and 3 micrometers.

22. Composite material according to claim 7, characterized in that the matrix (4) is a ceramic, vitroceramic or glass matrix.

23. Composite material according to claim 5, characterized in that the matrix (4) is boron carbonitride in the crystalline state.

24. Composite material according to claim 5, characterized in that the matrix (4) is of $Si_3N_4$, SiC, LAS, MLAS or AlN.

25. Composite material according to claim 5, characterized in that the fibres (2) are nonmetallic fibres.

26. Composite material according to claim 5, characterized in that the fibres (2) are of SiC, $Si_3N_4$, $Al_2O_3$, $SiO_2$, BAS or SiCN.

27. Composite material according to claim 5, characterized in that the boron carbonitride is formed by chemical vapour deposition using a reactive gaseous source mixture of boron and nitrogenous hydrocarbon diluted in a carrier gas.

28. Composite material according to claim 5, characterized in that the boron carbonitride is formed by chemical vapour deposition using a reactive gaseous source mixture of boron, ammonia and hydrocarbon diluted in a carrier gas.

29. Composite material according to claim 28, characterized in that the boron trichloride/ammonia ratio >1.

30. Composite material according to claim 28, characterized in that the partial ammonia pressure is at the most equal to the partial hydrocarbon pressure.

31. Composite material according to claim 28, characterized in that the hydrocarbon is acetylene.

32. Composite material according to claim 28, characterized in that the dilution rate of the reactive mixture in the carrier gas exceeds 10.

33. Composite material according to claim 28, characterized in that there is a gradual variation of the ammonia quantity in the reactive mixture.

34. Composite material according to claim 28, characterized in that there is a gradual decrease of the ammonia quantity in the reactive mixture.

35. Composite material having a fibrous reinforcement, incorporating refractory fibres embedded in a nonmetallic matrix and an interphase material interposed between the fibres and the matrix, characterized in that the interphase material has a thickness between 0.05 and 3 micrometers, and comprises a solid solution having a structure selected from the group consisting of a lamellar structure, an amorphous structure, and an intermediate structure between the amorphous and the lamellar structure, said solid solution comprises a boron carbonitride and contains, in atomic %, 5 to 50% nitrogen, 5 to 85% carbon and 10 to 50% boron.

36. Composite material having a fibrous reinforcement, incorporating refractory fibres embedded in a nonmetallic matrix and an interphase material interposed between the fibres and the matrix, characterized in that the interphase material has a thickness between 0.05 and 3 micrometers, and comprises a solid solution having a structure selected from the group consisting of a lamellar structure, an amorphous structure, and an intermediate structure between the amorphous and the lamellar structure, said solid solution comprises a boron carbonitride of the formula $C_5B_2N$.

37. Composite material having a fibrous reinforcement, incorporating refractory fibres embedded in a nonmetallic matrix characterized in that the matrix is boron carbonitride in the crystalline state, and an interphase material interposed between the fibres and the matrix, characterized in that the interphase material has a thickness of 0.053 micrometers, and comprises a solid solution having a structure selected from the group consisting of a lamellar structure, an amorphous structure, and an intermediate structure between the amorphous and lamellar structure, said solid solution containing an atomic % 1–99% carbon, 1–99% boron, and up to 98% nitrogen.

38. Process for producing a composite material with a fibrous reinforcement having the following stages:
   a) deposition of a boron carbonitride interphase material (6) on the refractory fibres (2), the boron carbonitride having an atomic % composition of 0 to 98% nitrogen, 1 to 99% carbon and 1 to 99% boron and a lamellar and/or amorphous structure,
   b) the formation of a porous fibrous reinforcement from the fibres coated with the interphase material, and
   c) densification (26) of the porous reinforcement obtained in b) for forming a nonmetallic matrix (4).

39. Process for producing a composite material with a fibrous reinforcement having the following stages:
   a') formation (20) of a porous fibrous reinforcement from refractory fibres,
   b') infiltration (24) of the boron carbonitride into the porous reinforcement obtained in a') for forming an interphase material (6) on the fibres, the boron carbonitride having an atomic % composition of 0 to 98% nitrogen, 1 to 99% carbon and 1 to 99% boron and a lamellar and/or amorphous structure and
   c') densification (26) of the porous reinforcement obtained in b') for forming a nonmetallic matrix (4).

* * * * *

UNITED STATES PATENT AND TRADEMARK OFFICE
CERTIFICATE OF CORRECTION

PATENT NO. : 5,334,438
DATED : AUGUST 2, 1994
INVENTOR(S) : FREDERIC SAUGNAC

It is certified that error appears in the above-identified patent and that said Letters Patent is hereby corrected as shown below:

CLAIM 22, COL. 9, LINE 7, "7" SHOULD BE --5--

Signed and Sealed this

Third Day of January, 1995

Attest:

BRUCE LEHMAN

Attesting Officer    Commissioner of Patents and Trademarks